US008573817B2

(12) United States Patent
Fang

(10) Patent No.: US 8,573,817 B2
(45) Date of Patent: Nov. 5, 2013

(54) LIGHT DEVICE WITH ENHANCED FLOW RATE AND COOLING EFFICIENCY AND REDUCED NOISE AND A COOLING UNIT THEREOF

(75) Inventor: I-Le Fang, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 16 days.

(21) Appl. No.: 13/406,300

(22) Filed: Feb. 27, 2012

(65) Prior Publication Data

US 2013/0170234 A1 Jul. 4, 2013

(30) Foreign Application Priority Data

Dec. 28, 2011 (TW) ............................. 100149237 A

(51) Int. Cl.

| | |
|---|---|
| ***F21V 29/00*** | (2006.01) |
| ***F21V 29/02*** | (2006.01) |
| ***H01J 61/52*** | (2006.01) |
| ***H01L 33/64*** | (2010.01) |

(52) U.S. Cl.

USPC ............... 362/373; 313/35; 313/46; 362/294; 362/345

(58) Field of Classification Search

USPC ............... 362/373, 294, 345, 547; 313/11–47

See application file for complete search history.

(56) References Cited

U.S. PATENT DOCUMENTS

| | | | |
|---|---|---|---|
| 2009/0200908 | A1 | 8/2009 | Mart |
| 2010/0237782 | A1 | 9/2010 | Horng |
| 2010/0315004 | A1 | 12/2010 | Horng |

*Primary Examiner* — Joseph L Williams

(74) *Attorney, Agent, or Firm* — Muncy, Geissler, Olds & Lowe, PLLC

(57) ABSTRACT

A light device including a housing, a cooling unit and a light emitting unit is disclosed. The housing has an assembly opening and an electrical base. The cooling unit is in the housing and has a heat dissipating seat, a driving member electrically connecting with the electrical base, and a fan wheel rotatably coupled with the driving member. The heat dissipating seat has a lateral wall coupled with the housing, an inner air channel formed in the lateral wall, a base portion arranged in the inner air channel for the driving member to be mounted, and at least one through hole penetrating the base portion and communicating with the inner air channel. The light emitting unit is coupled with the heat dissipating seat and electrically connects with the electrical base. An outer air channel is formed between the lateral wall and the housing.

11 Claims, 10 Drawing Sheets

LIGHT DEVICE WITH ENHANCED FLOW RATE AND COOLING EFFICIENCY AND REDUCED NOISE AND A COOLING UNIT THEREOF

BACKGROUND OF THE INVENTION

1. Field of the Invention

The present invention relates to a light device and, more particularly, to a light device with high cooing efficiency and low operation noise.

2. Description of the Related Art

Referring to FIGS. 1-3, a conventional light device with a cooling unit is disclosed, wherein the conventional light device labeled as "9" includes a housing 91, a heat sink 92, a cooling fan 93, a light emitting unit 94 and a light-permeable bulb 95. The housing 91 has an assembly opening 911. The heat sink 92 is mounted in the housing 91 via the assembly opening 911 and has a receiving room 921 on one side, a first air channel 922 communicating the outside and the inside of the housing 91, and a second air channel 923 communicating the bottom of the receiving room 921 and the outside of the housing 91. The cooling fan 93 includes a casing 931 forming a cylindrical channel and received in the receiving room 921, a driving motor (not illustrated) having a stator firmly arranged in the cylindrical channel of the casing 931, and a fan wheel 932 mounted on a rotor of the motor to rotate relatively to the casing 931. The light emitting unit 94 is mounted on another side of the heat sink 92 to emit light outside the housing 91 via the assembly opening 911. The light-permeable bulb 95 is mounted on the heat sink 92 and covers the light emitting unit 94.

When the light device 9 having the above structures is in operation, with the motor of the cooling fan 93 and the light emitting unit 94 being electrified, the heat generated by the light emitting unit 94 can be transmitted to the heat sink 92 for the cooling fan 93 to dissipate the heat. Specifically, the fan wheel 932 of the cooling fan 93 can drive the air outside the housing 91 to flow into the housing 91 through the first air channel 922, to pass through the cylindrical channel of the casing 931 from the top of the casing 931 to the bottom thereof, and to be exhausted out of the housing 91 via the second air channel 923. Accordingly, the working temperature of the light emitting unit 94 is kept in a lower range to prolong the life of the light device 9.

However, since the cooling fan 93 of the light device 9 includes the casing 931, the bottom of the casing 931 extending between the receiving room 921 and the second air channel 923 can easily lead to turbulence causing large operation noise, low cooling efficiency and a low flow rate. Besides, the structure of the heat sink 92 is complex for forming the first and second air channel 922, 923, and thus the heat sink 92 of the light device 9 will lead to high manufacture cost.

Therefore, it is necessary to improve this conventional light device 9 to have great smoothness in air guiding, low operation noise, high cooling efficiency and low manufacture cost.

SUMMARY OF THE INVENTION

It is therefore the primary objective of this invention to provide a light device and a cooling unit thereof, with a driving member directly mounted on a heat dissipating seat of the cooling unit to smoothly guide the air current in an inner air channel of the heat dissipating seat, so as to enhance flow rate and cooling effect and lower operation noise.

Another objective of this invention is providing a light device and a cooling unit thereof merely forming the inner air channel inside the heat dissipating seat while an outer air channel is formed between the heat dissipating seat and a housing, so as to simplify the structure and manufacture cost thereof.

The invention discloses a light device including a housing, a cooling unit, and a light emitting unit. The housing has an assembly opening and an electrical base arranged at two ends thereof. The cooling unit is received in the housing via the assembly opening and has a heat dissipating seat, a driving member and a fan wheel, wherein the heat dissipating seat has a lateral wall coupled with the housing, an inner air channel formed in the lateral wall, a base portion arranged in the inner air channel, and at least one through hole penetrating the base portion and communicating with the inner air channel, the driving member is mounted on the base portion and electrically connects with the electrical base, and the fan wheel is rotatably coupled with the driving member. The light emitting unit is coupled with the heat dissipating seat and electrically connects with the electrical base. An outer air channel is formed between the lateral wall of the heat dissipating seat and the housing.

The invention further discloses that the cooling unit further has a coupling member arranged between the driving member and the heat dissipating seat, with the coupling member having a vent opening communicating with the at least one through hole.

The invention also discloses a cooling unit of a light device including a heat dissipating seat, a driving member, a fan wheel and a coupling member. The heat dissipating seat has a lateral wall, an inner air channel formed in the lateral wall, a base portion arranged in the inner air channel, and at least one through hole penetrating the base portion and communicating with the inner air channel. The driving member is mounted on the base portion. The fan wheel is rotatably coupled with the driving member. The coupling member is arranged between the driving member and the heat dissipating seat and has a vent opening communicating with the at least one through hole.

The invention further discloses that, whether the cooling unit is mounted inside the light device or not, the coupling member has a substrate arranged in the inner air channel and supporting the driving member, an engaging portion abutting against a surface of the lateral wall facing the inner air channel, and a linking rib linking the substrate and the engaging portion.

The invention further discloses that, whether the cooling unit is mounted inside the light device or not, the engaging portion is in a form of a ring surrounding the fan wheel.

The invention further discloses that, whether the cooling unit is mounted inside the light device or not, the coupling member has a backflow blocker extending outwards from the engaging portion in a radial direction of the fan wheel and aligning with the at least one through hole in an axial direction of the fan wheel.

The invention further discloses that, whether the cooling unit is mounted inside the light device or not, a gap is formed between the substrate of the coupling member and the heat dissipating seat.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
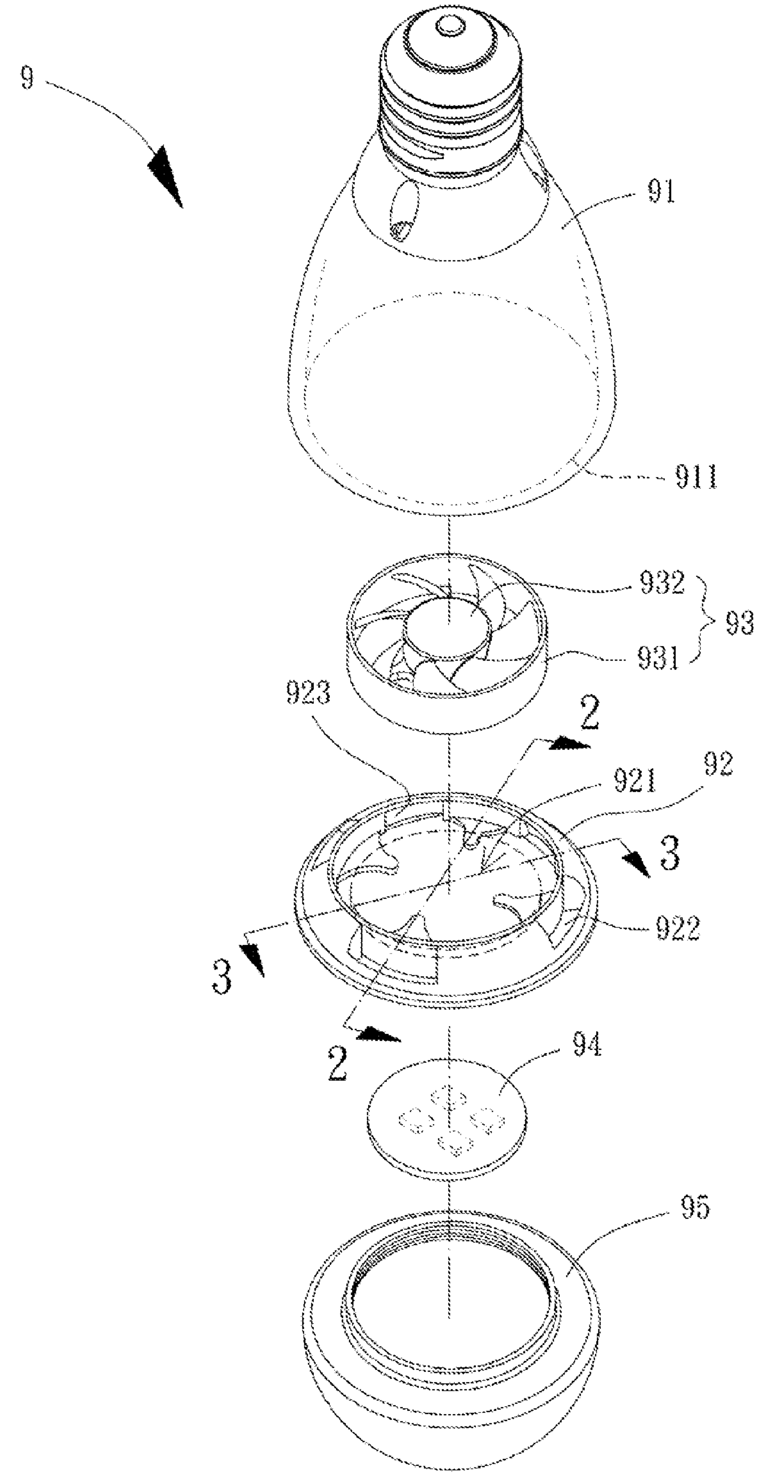
FIG. 1 PRIOR ART
FIG. 1 shows a perspective and exploded view of a conventional light device.
Figure 2:
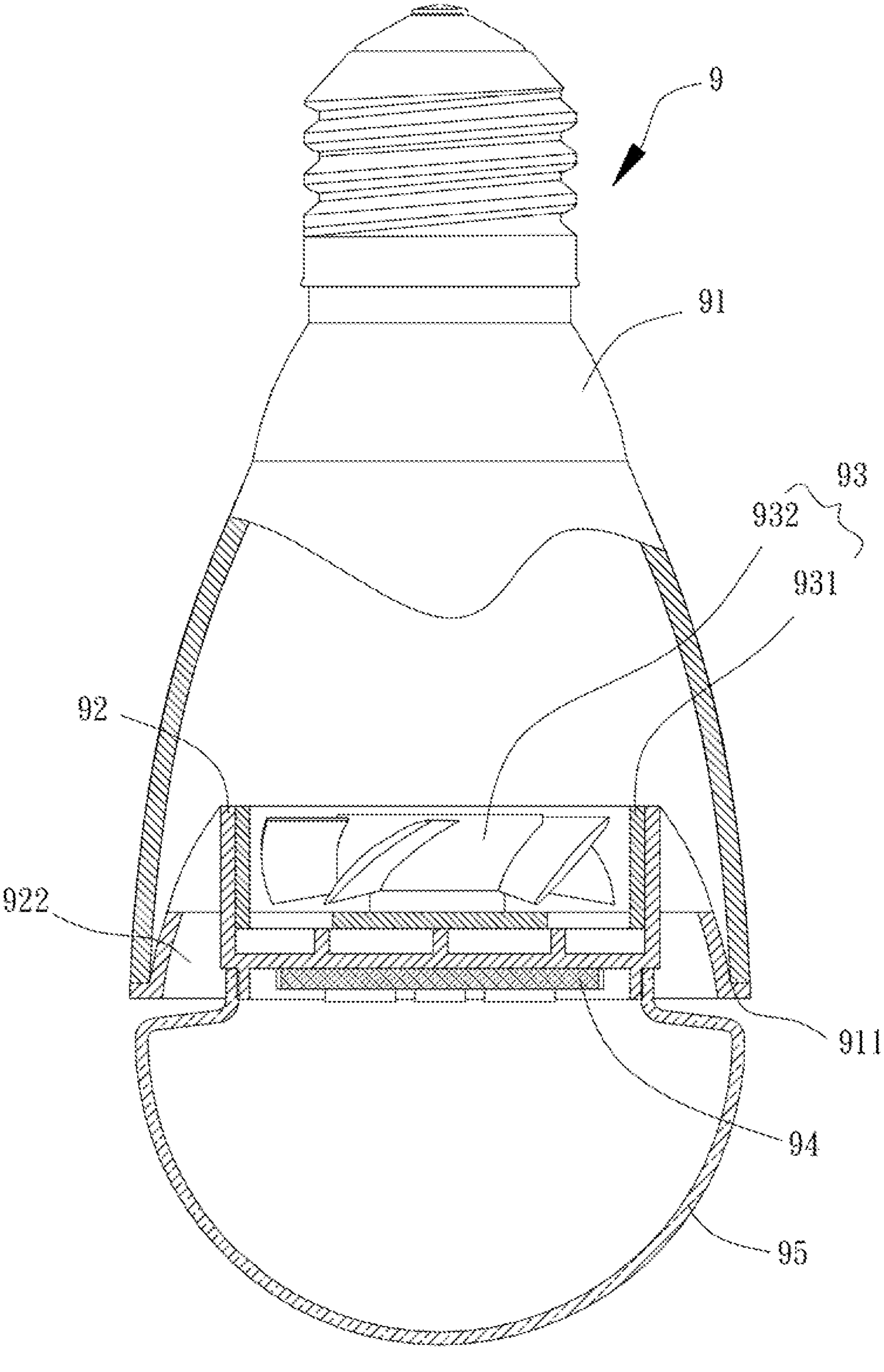
FIG. 2 PRIOR ART
FIG. 2 shows a cross-sectional view of the conventional light device along a 2-2 line in FIG. 1.
Figure 3:
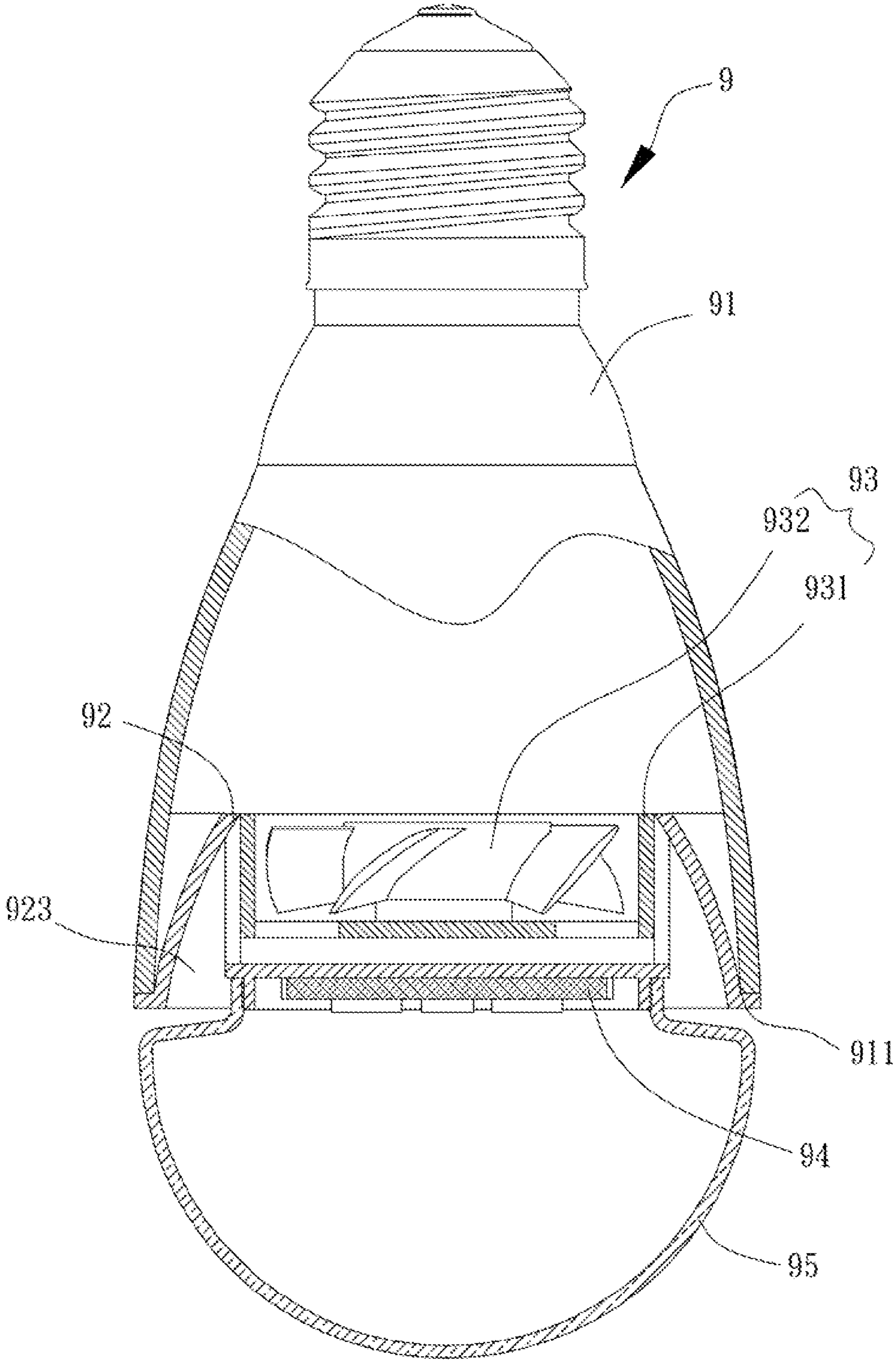
FIG. 3 PRIOR ART
FIG. 3 shows a cross-sectional view of the conventional light device along a 3-3 line in FIG. 1.

In the various figures of the drawings, the same numerals designate the same or similar parts. Furthermore, when the term "first," "second," "inwards," "outwards," "inner," "outer" and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

Please refer to FIGS. 4-7. A light device according to a first embodiment of the invention is shown, which includes a housing 1, a cooling unit 2 received in the housing 1, and a light emitting unit 3 coupled with the cooling unit 2.

Figure 4:
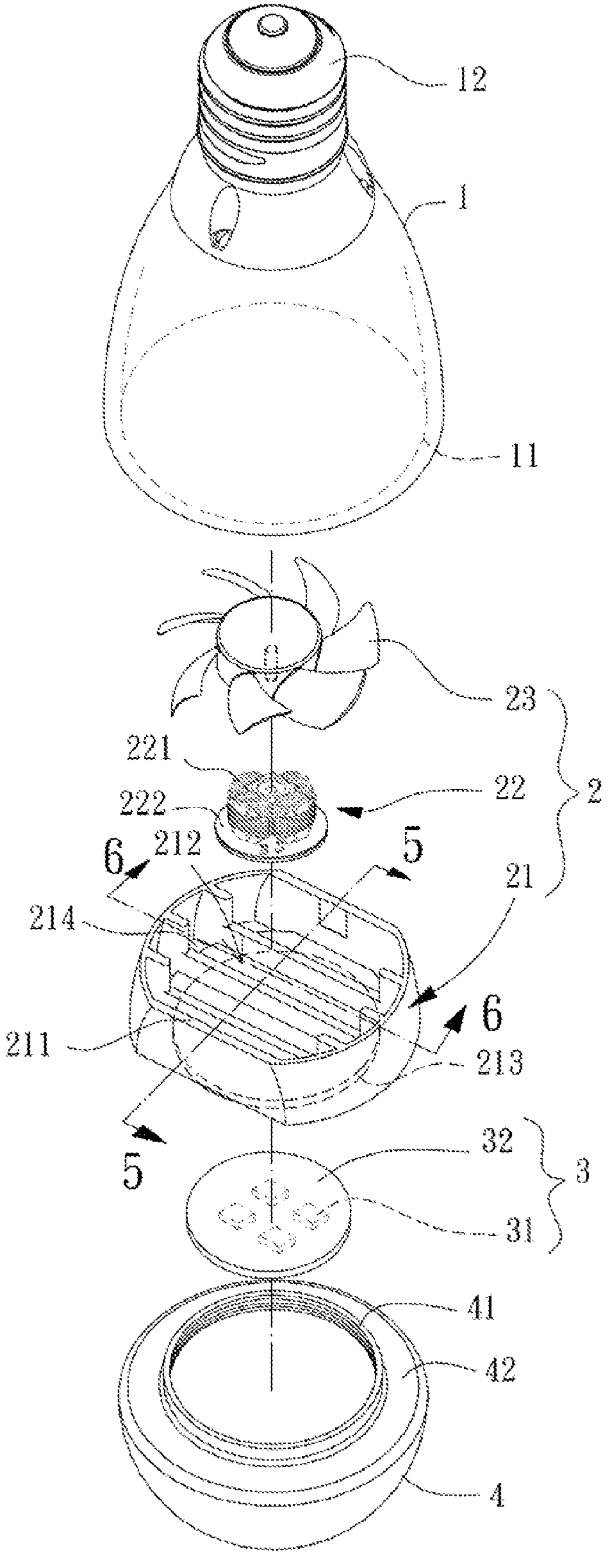
FIG. 4 shows a perspective and exploded view of a light device according to a first embodiment of the invention.
Figure 5:
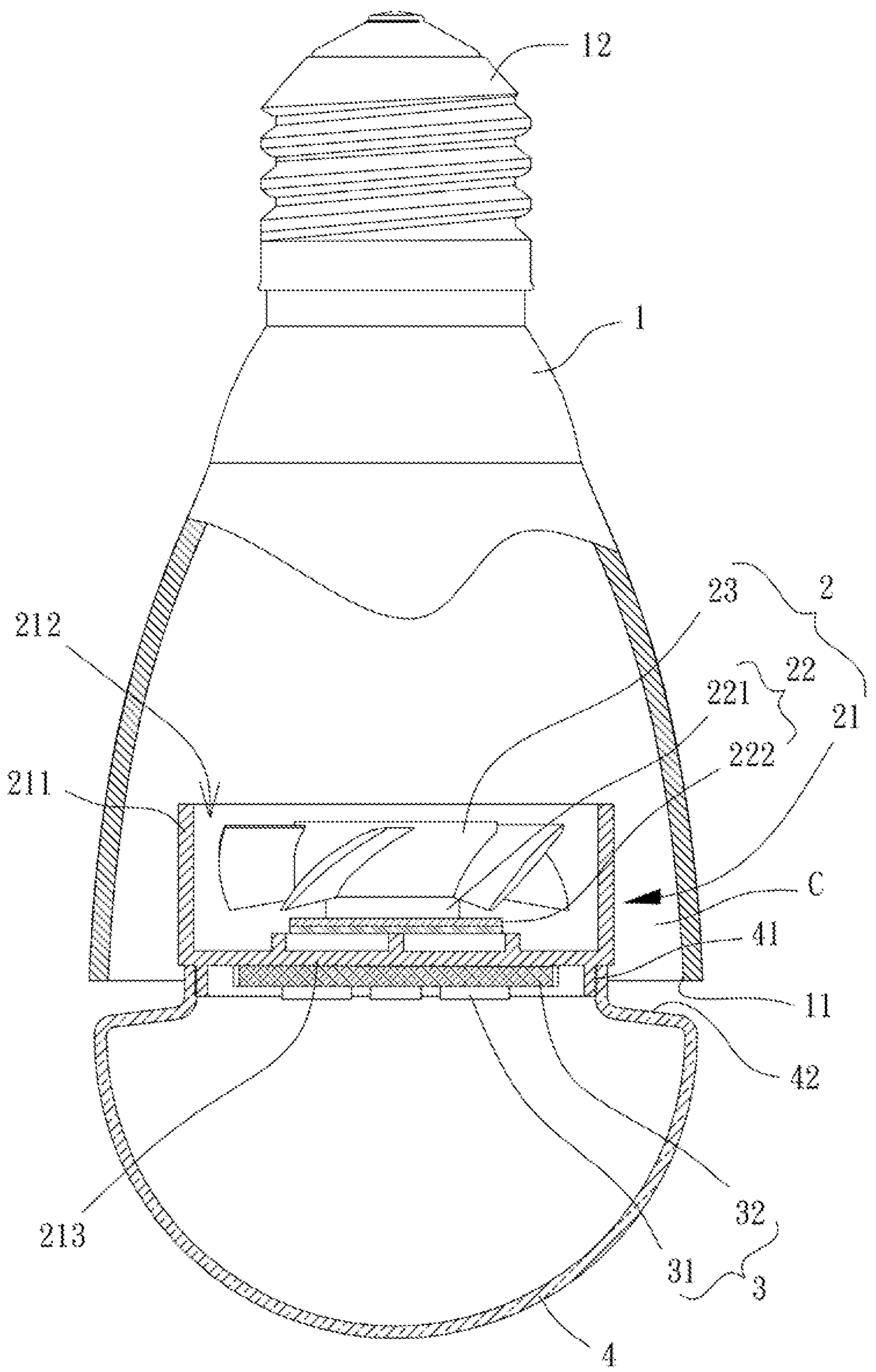
FIG. 5 shows a cross-sectional view of the light device according to the first embodiment of the invention along a 5-5 line in FIG. 4.
Figure 6:
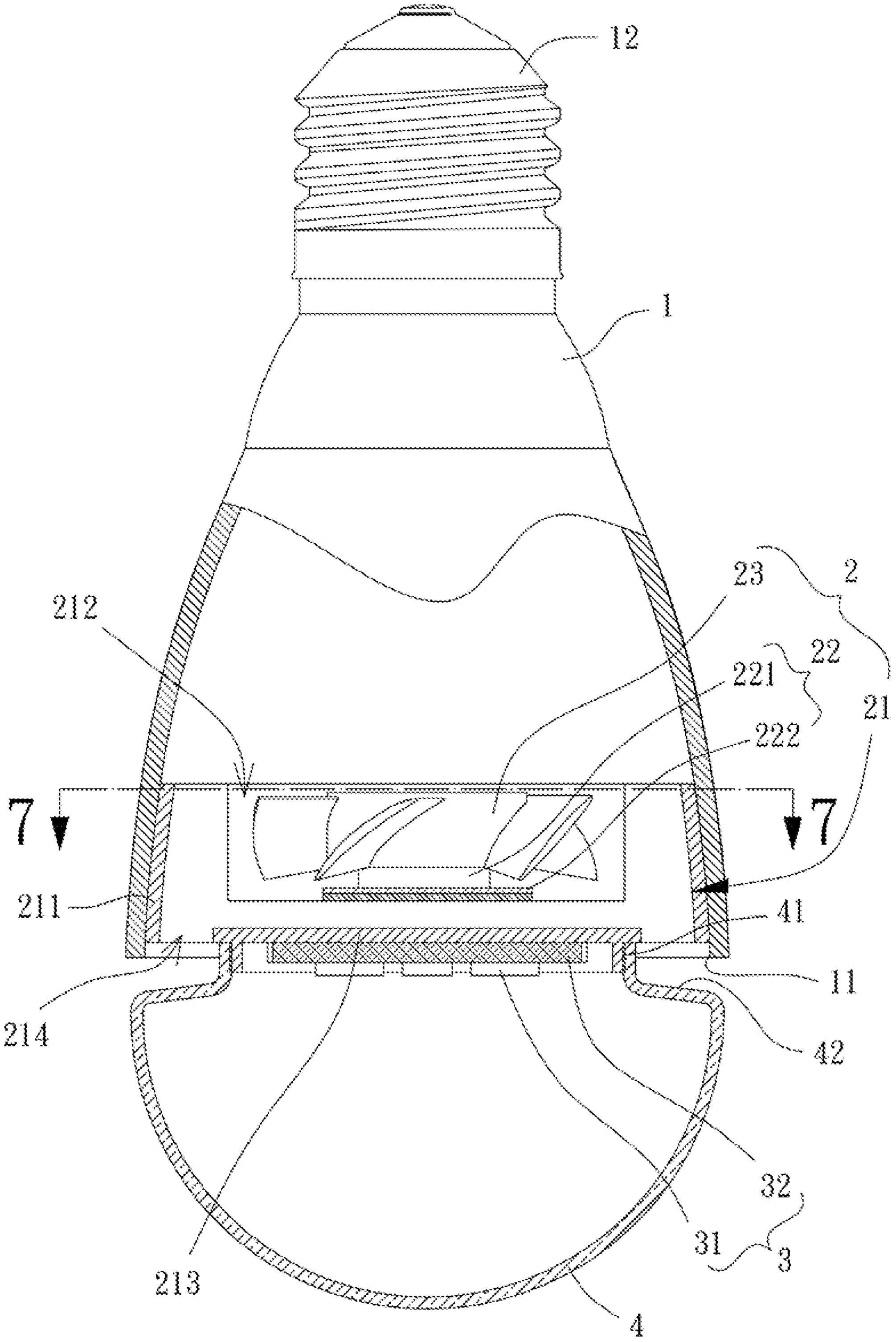
FIG. 6 shows a cross-sectional view of the light device according to the first embodiment of the invention along a 6-6 line in FIG. 4.
Figure 7:
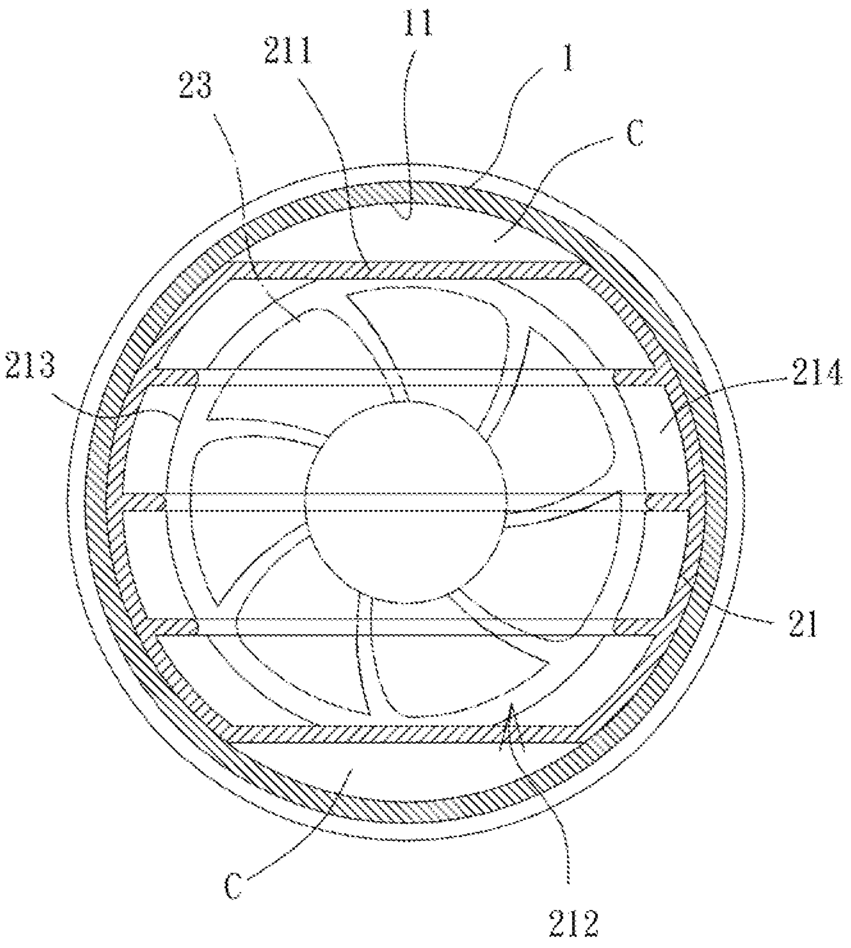
FIG. 7 shows a cross-sectional view of the light device according to the first embodiment of the invention along a 7-7 line in FIG. 6.

The housing 1 is a hollow case with an assembly opening 11 and an electrical base 12 arranged at two ends of the housing 1, which are preferably two opposite ends of the housing 1 as shown in FIG. 4. The assembly opening 11 communicates with an inner room of the housing 1 for the cooling unit 2 to be inserted into the inner room via the assembly opening 11. The electrical base 12 is adapted to connect with a lamp holder for accessing electrical power.

The cooling unit 2 received in the inner room of the housing 1 has a heat dissipating seat 21, a driving member 22 and a fan wheel 23. The heat dissipating seat 21 is made of heat conductive material such as aluminum ally and has a lateral wall 211, an inner air channel 212, a base portion 213 and at least one through hole 214. The lateral wall 211 is coupled with the housing 1 and is preferably in the form of an annular wall as shown in FIG. 4. The inner air channel 212 is formed in the lateral wall 211, that is, surrounded by the lateral wall 211. The base portion 213 is arranged in the inner air channel 212 and is preferably adjacent to the assembly opening 11 of the housing 1. The at least one through hole 214 penetrates the base portion 213 and communicates with the inner air channel 212. Furthermore, once the heat dissipating seat 21 is firmly coupled with the housing 1, there is at least one outer air channel "C" formed between the lateral wall 211 of the heat dissipating seat 21 and the housing 1. The driving member 22 is mounted on the base portion 213 of the heat dissipating seat 21 in the inner air channel 212 and electrically connects with the electrical base 12 of the housing 1, wherein the driving member 22 may be coupled with the heat dissipating seat 21 through a heat insulation layer so as to avoid damage to the driving member 22 caused by heat transmitted to the heat dissipating seat 21. In this embodiment, the driving member 22 includes a motor stator 221 and a circuit board 222, wherein the motor stator 221 generates an alternating magnetic field according to control signals and the circuit board 222 connects between the electrical base 12 and the motor stator 221 for generating the control signals. However, the circuit board 222 can be omitted from the driving member 22 with the motor stator 221 directly connecting to the electrical base 12 or with the motor stator 221 connecting to an outer circuit board. The fan wheel 23 includes a motor rotor (not illustrated) arranged in correspondence with the motor stator 221 to rotate according to the alternating magnetic field generated by the motor stator 221, so as to rotate relatively to the driving member 22. Moreover, referring to FIG. 7, the outer air channel "C" and the at least one through hole 214 are arranged in a stagger way so that the air channel "C" and the at least one through hole 214 do not overlap each other in an axial direction of the fan wheel 23.

The light emitting unit 3 is coupled with the heat dissipating seat 21 of the cooling unit 2 and faces the outside of the housing 1 through the assembly opening 11. The light emitting unit 3 includes a light emitting member 31 and a control board 32. The light emitting member 31 can be constructed by LEDs, bulbs or any other conventional light emitting device. The control board 32 electrically connects with the light emitting member 31 and the electrical base 12 of the housing 1 respectively and abuts against the heat dissipating seat 21. However, the control board 32 can also be omitted from the light emitting unit 3, with the light emitting member 31 directly abutting against the heat dissipating seat 21. As a result, the cooling unit 2 can efficiently lower the working temperature of the light emitting unit 3 to achieve a desirable cooling effect.

In this embodiment, it is preferable that a light-permeable bulb 4 with an opening portion 41 coupled to the heat dissipating seat 21 is provided so as to receive the light emitting unit 3 inside the light-permeable bulb 4 via the opening portion 41. Accordingly, the light-permeable bulb 4 can protect the light emitting unit 3 from external damage and serves as a dust cover to the light emitting unit 3. Moreover, the light-permeable bulb 4 can further forms an air guiding wall 42 facing the assembly opening 11 to define an air passage between the air guiding wall 42 and the housing 1 and communicating with the assembly opening 11.

In use, the electrical base 12 of the housing 1 of the present light device is electrically connected with a utility network through the said lamp holder to provide the driving member 22 of the cooling unit 2 and the control board 32 of the light emitting unit 3 with electrical power, so that the fan wheel 23 can be nm and the light emitting member 31 can be controlled to emit light. When the fan wheel 23 is turned, in accordance with the rotational direction of the fan wheel 23, one of the outer and inner air channels "C," 212 may serve as an air inlet of this light device while the other one of them serves as an air outlet since the outer air channel "C" communicates with the outside of the housing 1 via the assembly opening 11 and the inner air channel 212 also communicates with the outside of the housing 1 via the at least one through hole 214 and the assembly opening 11. Specifically, the fan wheel 23 can be controlled to turn in a first direction to draw cool air from the outside of the housing 1 into the inside of the housing 1 through the outer air channel "C" and the assembly opening 11 and to discharge hot air through the inner air channel 212, the at least one through hole 214 and the assembly opening 11. Alternatively, the fan wheel 23 can be controlled to turn in a second direction opposite to the first direction to draw in cool air outside the housing 1 via the inner air channel 212 and to discharge hot air inside the housing 1 via the outer air channel "C." It should be noticed that, no matter in which direction the fan wheel 23 turns to draw in cool air into or discharge hot air out of the housing 1 through the inner air channel 212 and the at least one through hole 214, no turbulence is formed in the inner air channel 212 since there is nothing blocked between the fan wheel 23 and the at least one through hole 214. Accordingly, flow rate of the air current in the inner air channel 212 and cooling effect of this light device are enhanced as well as operation noise of the light device is reduced. Additionally, the heat dissipating seat 21 can provide the light device with both of the air inlet and air outlet by merely forming the at least one through hole 214 because the outer air channel "C" is a gateway defined by the lateral wall 211 of the heat dissipating seat 21 and the housing 1, and thus the structure of the heat dissipating seat 21 is simple, which may result in a low cost in manufacture.

Figure 8:
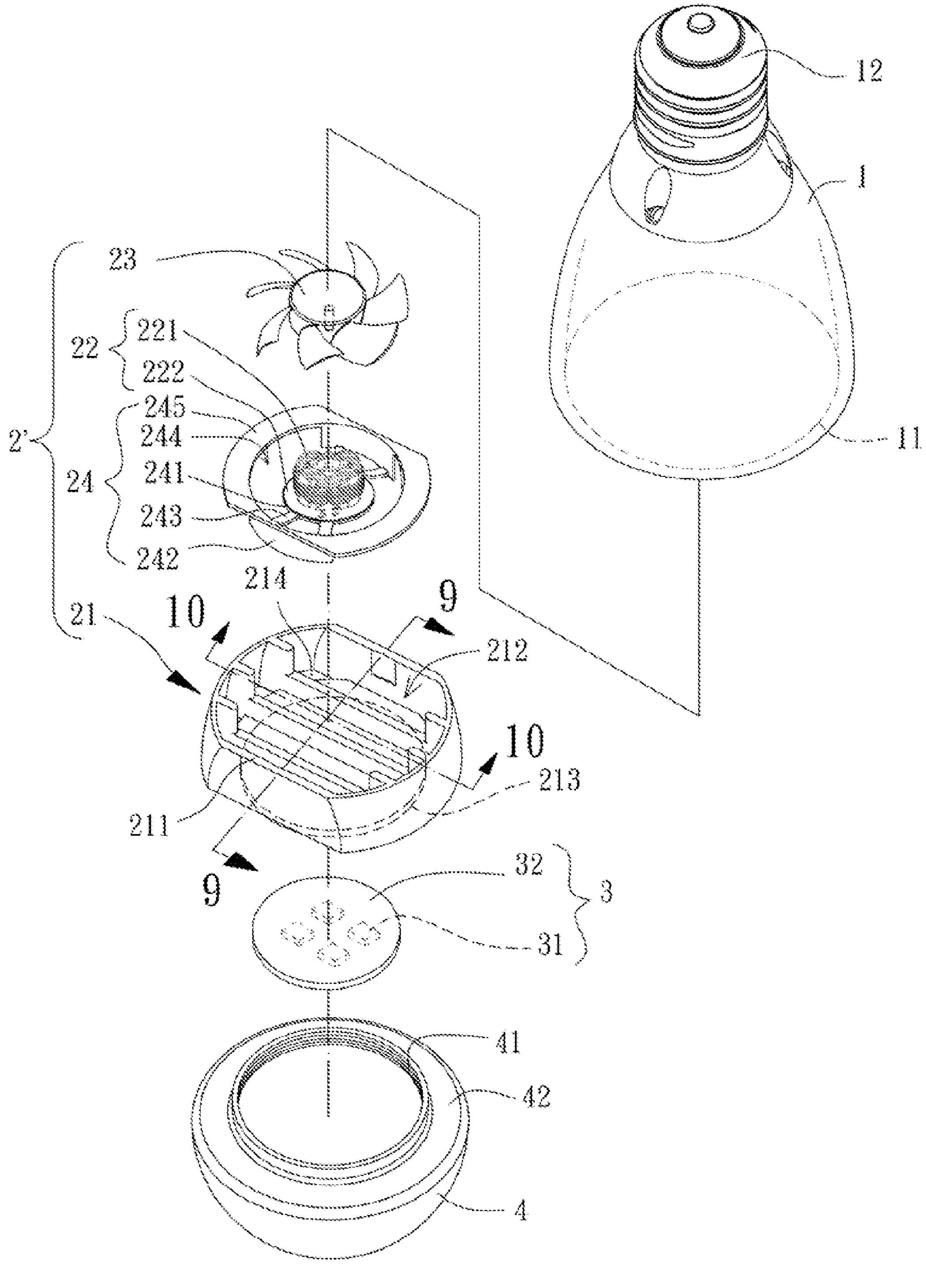
FIG. 8 shows a perspective and exploded view of a light device according to a second embodiment of the invention.
Figure 9:
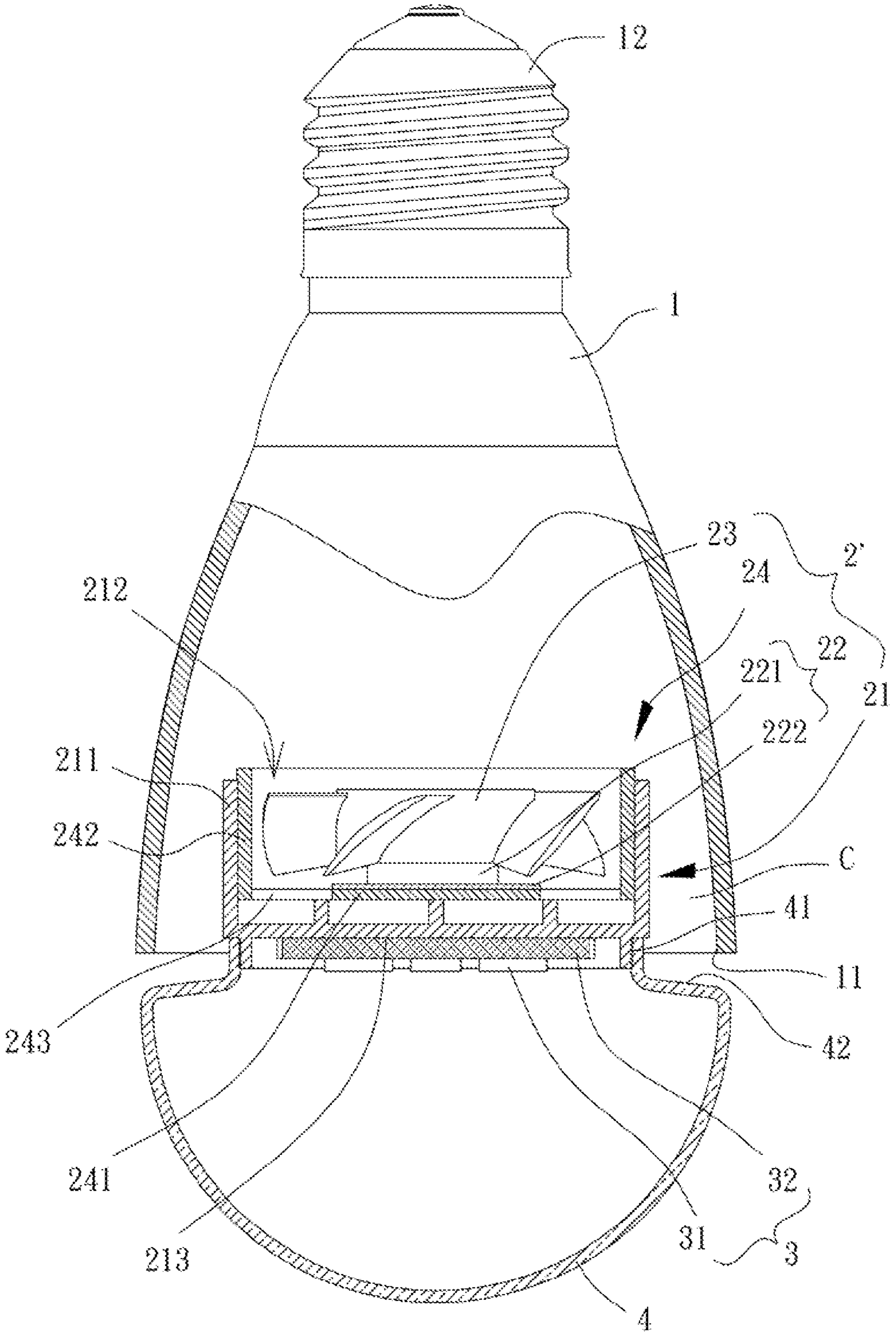
FIG. 9 shows a cross-sectional view of the light device according to the second embodiment of the invention along a 9-9 line in FIG. 8.
Figure 10:
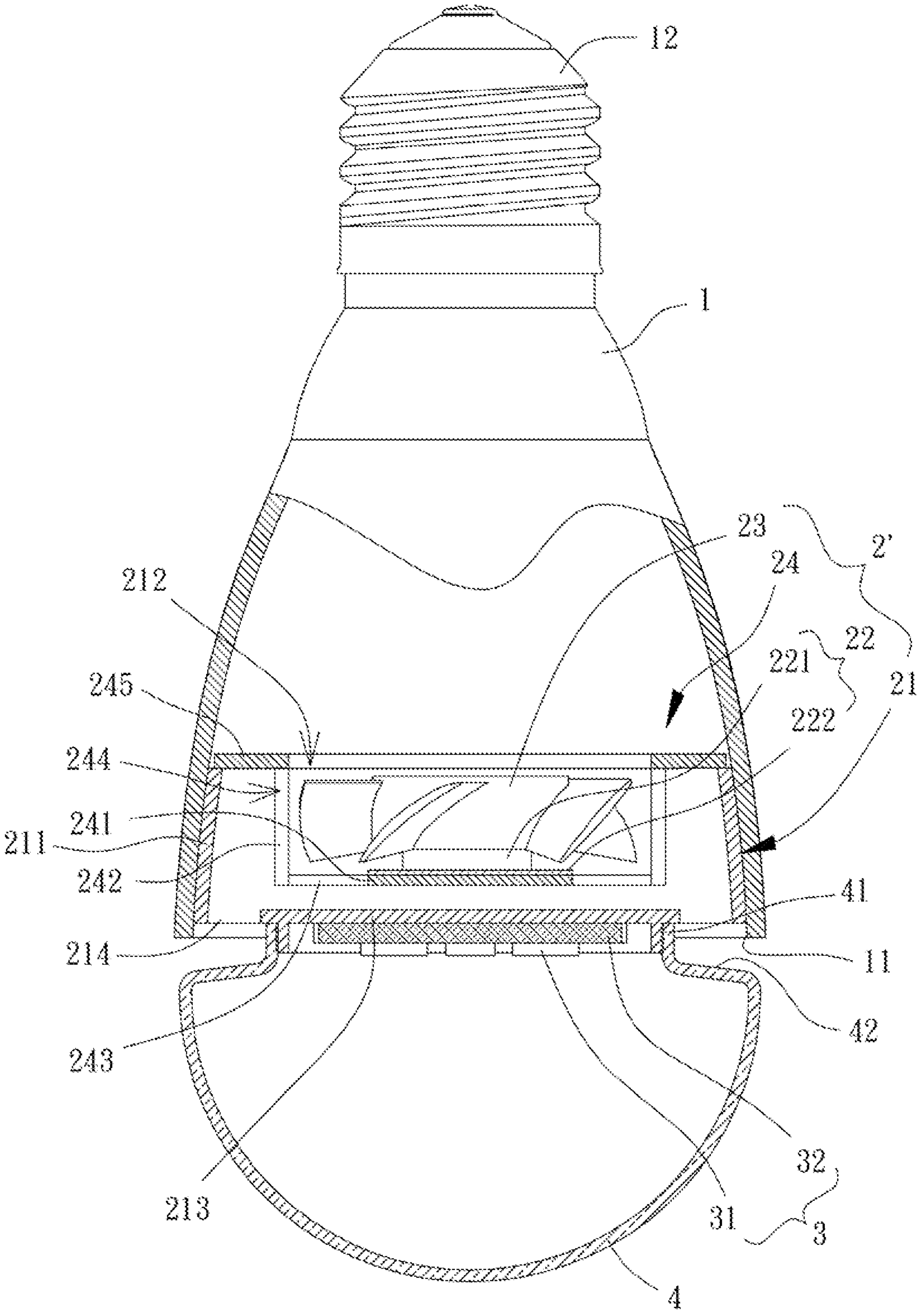
FIG. 10 shows a cross-sectional view of the light device according to the second embodiment of the invention along a 10-10 line in FIG. 8.

Referring to FIGS. 8-10, a light device according to a second embodiment of the invention is shown. In comparison with the cooling unit 2 of the first embodiment, the cooling unit 2' of this second embodiment further has a coupling member 24 in addition to the heat dissipating seat 21, driving member 22 and fan wheel 23, with the coupling member 24 arranged between the driving member 22 and the heat dissipating seat 21 to further secure the position of the driving member 22 inside the inner air channel 212. Particularly, the coupling member 24 includes a substrate 241, an engaging portion 242, a linking rib 243, a vent opening 244 and a backflow blocker 245. The substrate 241 is arranged in the inner air channel 212 and supports the driving member 22. The engaging portion 242 abuts against a surface of the lateral wall 211 facing the inner air channel 212 to firmly position the coupling member 24 relatively to the heat dissipating seat 21, with the engaging portion 242 preferably in the form of a ring surrounding the fan wheel 23. The linking rib 243 links the substrate 241 and the engaging portion 242 to hold the substrate 241. The vent opening 244 is formed in the engaging portion 242 and is adjacent to and communicates with the at least one through hole 214. Specifically, the vent opening 244 is used to form the engaging portion 242 into a frame-like structure for the air current between the fan wheel 23 and the through hole 214 to flow straight, and the shape of the vent opening 244 is not limited. The backflow blocker 245 extends outwards from the engaging portion 242 in a radial direction of the fan wheel 23 and aligns with the at least one through hole 214 in the axial direction of the fan wheel 23, so as to prevent hot air that should be discharged via the through hole 214 by the fan wheel 23 from reversely flowing back to the inner of the housing 1. Preferably, there may be a gap between the substrate 241 of the coupling member 24 and the heat dissipating seat 21 in order to improve heat-transmitting isolation between the base portion 213 and the driving member 22. With the vent opening 244 of the coupling member 24 communicating with the through hole 214, the coupling member 24 will not cause turbulence inside the housing 1. Consequently, the light device of the second embodiment can still provide enhanced flow rate and cooling effect and low operation noise, as well as further ensures coupling stability.

In sum, no matter the fan wheel 23 is directly mounted on the base portion 213 of the heat dissipating seat 21 or is positioned in the inner air channel 212 by the coupling member 24, the present light device may have enhanced flow rate and cooling effect and low operation noise. Besides, the present light device also has a simple structure and low manufacture cost due to the outer air channel "C" formed between the heat dissipating seat 21 and the housing 1.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A light device, comprising:

a housing with an assembly opening and an electrical base arranged at two ends thereof;

a cooling unit received in the housing via the assembly opening and having a heat dissipating seat, a driving member and a fan wheel, wherein the heat dissipating seat has a lateral wall coupled with the housing, an inner air channel formed in the lateral wall, a base portion arranged in the inner air channel, and at least one through hole penetrating the base portion and communicating with the inner air channel, the driving member is mounted on the base portion and electrically connects with the electrical base, and the fan wheel is rotatably coupled with the driving member; and a light emitting unit coupled with the heat dissipating seat and electrically connecting with the electrical base;

wherein an outer air channel is formed between the lateral wall of the heat dissipating seat and the housing.

2. The light device as claimed in claim 1, wherein the cooling unit further has a coupling member arranged between the driving member and the heat dissipating seat, with the coupling member having a vent opening communicating with the at least one through hole.

3. The light device as claimed in claim 2, wherein the coupling member has a substrate arranged in the inner air channel and supporting the driving member, an engaging portion abutting against a surface of the lateral wall facing the inner air channel, and a linking rib linking the substrate and the engaging portion.

4. The light device as claimed in claim 3, wherein the engaging portion is in a form of a ring surrounding the fan wheel.

5. The light device as claimed in claim 3, wherein the coupling member further has a backflow blocker extending outwards from the engaging portion in a radial direction of the fan wheel and aligning with the at least one through hole in an axial direction of the fan wheel.

6. The light device as claimed in claim 3, wherein a gap is formed between the substrate of the coupling member and the heat dissipating seat.

7. A cooling unit of a light device, comprising:

a heat dissipating seat having a lateral wall, an inner air channel formed in the lateral wall, a base portion arranged in the inner air channel, and at least one through hole penetrating the base portion and communicating with the inner air channel;

a driving member mounted on the base portion;

a fan wheel rotatably coupled with the driving member; and a coupling member arranged between the driving member and the heat dissipating seat and having a vent opening communicating with the at least one through hole.

8. The cooling unit of a light device as claimed in claim 7, wherein the coupling member has a substrate arranged in the inner air channel and supporting the driving member, an engaging portion abutting against a surface of the lateral wall facing the inner air channel, and a linking rib linking the substrate and the engaging portion.

9. The cooling unit of a light device as claimed in claim 8, wherein the engaging portion is in a form of a ring surrounding the fan wheel.

10. The cooling unit of a light device as claimed in claim 8, wherein the coupling member further has a backflow blocker extending outwards from the engaging portion in a radial direction of the fan wheel and aligning with the at least one through hole in an axial direction of the fan wheel.

11. The cooling unit of a light device as claimed in claim 8, wherein a gap is formed between the substrate of the coupling member and the heat dissipating seat.

* * * * *